(12) United States Patent
LoBianco et al.

(10) Patent No.: US 6,596,212 B1
(45) Date of Patent: Jul. 22, 2003

(54) METHOD AND APPARATUS FOR INCREASING THICKNESS OF MOLDED BODY ON SEMICONDUCTOR PACKAGE

(75) Inventors: Anthony LoBianco, Chandler, AZ (US); Jonathon Greenwood, Phoenix, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/528,884

(22) Filed: Mar. 20, 2000

(51) Int. Cl.[7] .................. B29C 45/02; B29C 70/74; B29C 45/14; B29C 70/78
(52) U.S. Cl. .............. 264/219; 264/272.15; 264/272.17; 264/275
(58) Field of Search .................. 264/219, 272.11, 264/272.15, 272.17, 275; 425/190; 249/155, 158, 157

(56) References Cited

U.S. PATENT DOCUMENTS

| | | | | |
|---|---|---|---|---|
| 5,049,526 A | * | 9/1991 | McShane et al. | 437/211 |
| 5,191,923 A | * | 3/1993 | Goss | 164/292 |
| 5,344,600 A | * | 9/1994 | McShane et al. | 264/219 |
| 5,609,889 A | * | 3/1997 | Weber | 425/116 |
| 5,766,535 A | * | 6/1998 | Ong | 264/272.15 |
| 5,776,512 A | * | 7/1998 | Weber | 425/116 |
| 5,958,466 A | * | 9/1999 | Ong | 425/127 |
| 5,961,912 A | * | 10/1999 | Huang et al. | 264/272.15 |

* cited by examiner

*Primary Examiner*—Angela Ortiz
(74) *Attorney, Agent, or Firm*—Bever, Hoffman & Harms, LLP; James E. Parsons

(57) ABSTRACT

A simple, inexpensive method and apparatus are provided for increasing the thickness of a body molded on a semiconductor package without the need for a new mold, or for reworking the parts of an existing mold. The method includes providing a mold having parts that engage each other at respective interfacial surfaces, and a shim having a selected thickness and an opening through an interior portion thereof. The shim is interposed between the interfacial surfaces of the mold parts such that the mold parts are spaced apart by the thickness of the shim, and such that the mold parts and the shim opening define a cavity in the mold. The length and width of the cavity of the mold thus remain the same, while the height of the cavity, and hence, the thickness of the molded body, is increased by the thickness of the shim.

10 Claims, 3 Drawing Sheets

METHOD AND APPARATUS FOR
INCREASING THICKNESS OF MOLDED
BODY ON SEMICONDUCTOR PACKAGE

BACKGROUND

1. Field of the Invention

The present invention relates generally to molding plastic bodies, and more particularly, to a method and apparatus for increasing the thickness of a molded plastic semiconductor package body without replacing or reworking the mold in which the body is molded.

2. Description of the Related Art

Many types of modern commercial semiconductor packaging techniques include encapsulating the components of the package in a dense, monolithic body of plastic, typically, a filled epoxy resin, to protect them from harmful environmental agents, e.g., moisture.

In the development, production, and evaluation of new, plastic-bodied semiconductor devices, it is frequently necessary to modify the thickness of the plastic body, or "mold cap," of the device, e.g., to accommodate different thicknesses of die, substrate, lead frame, or combinations thereof. However, new molds typically cost upwards of $100,000 per set and require 12–18 weeks to fabricate, and may eventually be scrapped in the event it subsequently becomes necessary to change the thickness of the package body molded therein.

For developmental or short-run production purposes, a less-expensive modification in package body thickness can sometimes be achieved using an existing mold. Thus, a reduction in the thickness of a molded body can sometimes be achieved by making a judicious surface cut on one or both of the interfacial surfaces of the mold parts, so that they engage each other more closely and thereby reduce the height of the mold cavity. An increase in the thickness of the package body using an existing mold is more difficult and expensive, and involves welding new material on the interfacial surface of one or both of the mold parts to build them up, then machining away the new material to form new interfacial surfaces on the mold parts that engage each other at the desired new cavity height. In either case, however, the welding and/or machining of the mold parts can be expensive, and often warps the mold irreparably, thereby rendering an expensive mold unusable.

In view of this problem, a need exists for a simple, inexpensive, and reliable method and apparatus for temporarily modifying an existing mold to increase the thickness of body molded therein without the need to produce a new mold or rework an existing mold.

SUMMARY OF THE INVENTION

This invention provides a simple, inexpensive method and apparatus for temporarily modifying an existing mold to increase the thickness of a body molded therein, e.g., the plastic body of a semiconductor package, without the need for a new mold, or for reworking the parts of the existing mold.

The method comprises providing a mold having parts that engage each other at respective interfacial surfaces thereof to define a cavity within the mold, and a shim having a selected thickness and an opening through an interior portion thereof. The shim opening has a periphery corresponding to the periphery of the cavity of the mold. The shim is interposed between the interfacial surfaces of the mold parts such that they are spaced apart by the thickness of the shim, thereby increasing the height of the mold cavity by the thickness of the shim. Thus, the length and width of the mold cavity thus remain the same, while the height of the cavity, and hence, the thickness of a body molded therein, is increased by the thickness of the shim.

The shim of the invention can be fabricated for a fraction of the cost of a new or re-worked mold chase, and can be obtained in a fraction of the time necessary to obtain either, and therefore represents an extremely cost-effective tool for the development, production, and evaluation of new semiconductor packages.

BRIEF DESCRIPTION OF THE SEVERAL VIEWS OF THE DRAWINGS

A better understanding of the above and other features and advantages of the invention may be obtained from a consideration of the detailed description of the exemplary embodiments thereof found below, especially if such consideration is made in conjunction with the various views of the associated drawings, wherein.

DETAILED DESCRIPTION OF THE EXEMPLARY EMBODIMENTS

Figure 1:
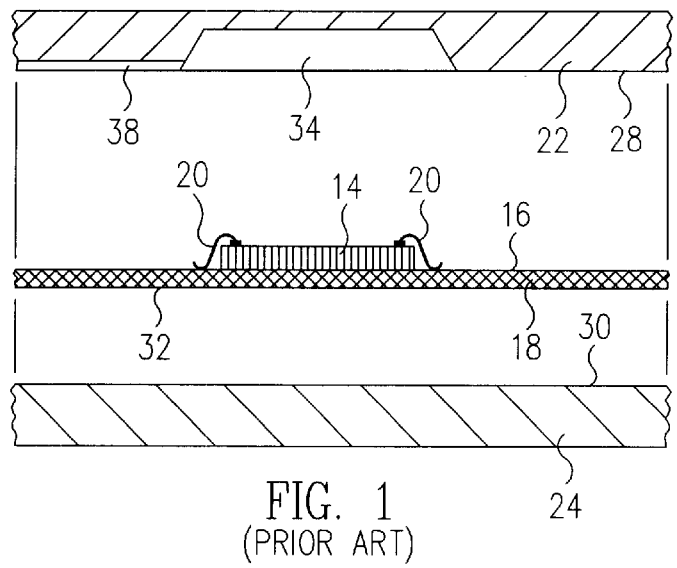
FIGS. 1–3 are sequential cross-sectional side elevation views of a prior art method and apparatus for molding a plastic body on a BGA type of semiconductor package.
Figure 2:
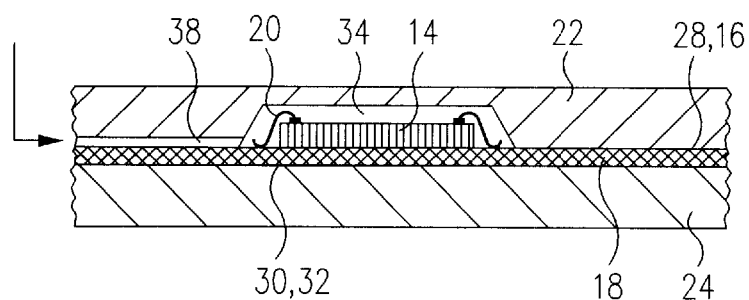
Figure 3:
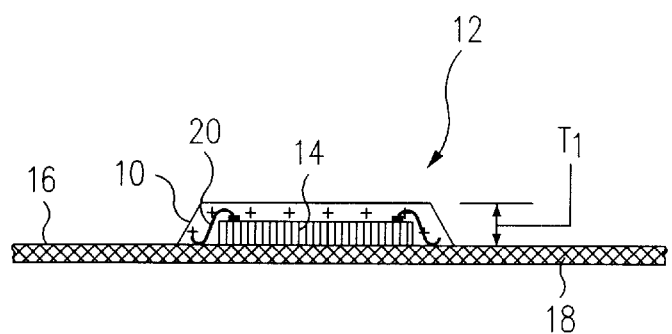

FIGS. 1–3 are sequential cross-sectional side elevation views of a conventional method and apparatus for molding a plastic body, or "mold cap" 10, on a ball grid array ("BGA") type of "surface mounting" semiconductor package 12. In this method, a semiconductor die, or "chip" 14, is mounted on a top surface 16 of an substrate 18 comprising an insulative sheet, and is electrically connected, e.g., with bonded wires 20, to conductive traces 21 thereon (see FIG. 8).

The die-substrate assembly is then clamped between the top and bottom parts, or "chases" 22 and 24, of a mold (FIGS. 1 and 2) such that the respective interfacial surfaces 28 and 30 of the mold parts 22, 24 contact a respective one of the top and bottom surfaces 16, 32 of the substrate 18, and such that the die 14 and a portion of the substrate reside within a mold cavity 34 defined by one or both of the top and bottom chases 22 of the mold. Molten plastic is then transferred under high pressure through a "runner," or sprue 38, leading into the cavity, in the direction of the arrow shown in FIG. 2, and into the cavity 34, where it hardens into the body of the mold cap 10 that covers and seals the die 12 and a portion of the top surface 16 of the substrate 18. Thus, it may be seen that the thickness $T_1$, of the body 10 of the package 12 (see FIG. 3) is defined by the height of the mold cavity 34.

When it becomes desirable, e.g., for developmental reasons, to increase the thickness $T_1$ of the package body 10, even if only by a very small amount, the package engineer is confronted with the choice of either procuring a new mold or substantially reworking an existing mold that produces a package body with the desired increased thickness. Both alternatives are expensive, time-consuming and risky, for the reasons discussed above.

However, a third alternative has now been discovered that is simple, quick, inexpensive, and risk-free, namely, the method and apparatus of the present invention described below, which permit an existing mold set to be "stretched," both literally and figuratively, to produce a package body 10 with an increased thickness at a fraction of the cost and in a fraction of the time necessary to procure a new mold or to rework the existing mold.

Figure 4:
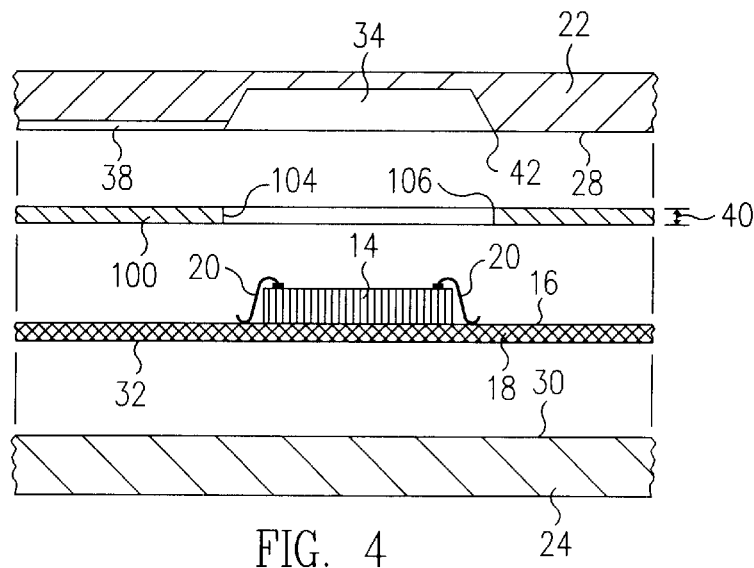
FIGS. 4–6 are sequential cross-sectional side elevation views similar to FIGS. 1–3, respectively, of an exemplary method and apparatus of the present invention for molding a plastic body of increased thickness on a BGA type of semiconductor package.
Figure 5:
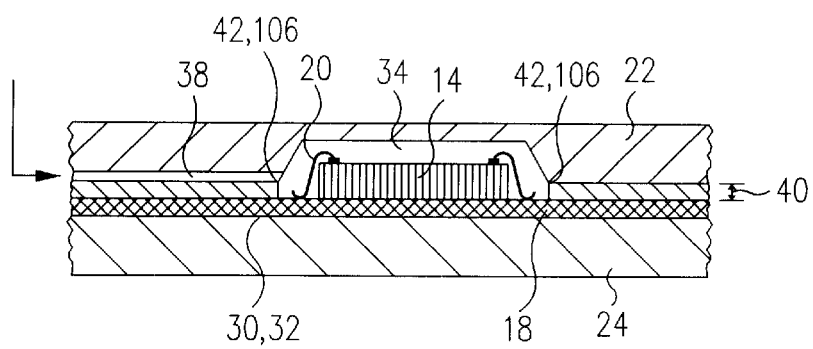
Figure 6:
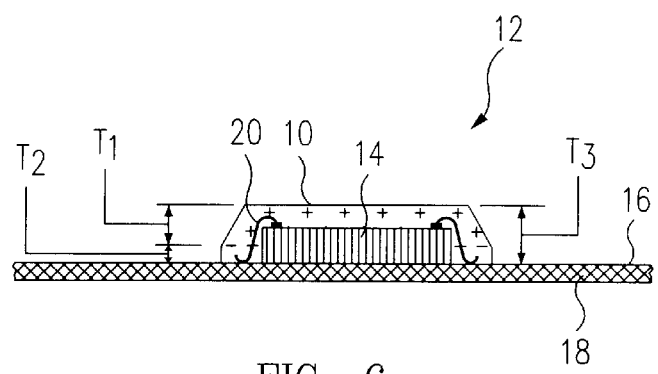

An exemplary method and apparatus of the invention are illustrated in the sequential cross-sectional side elevation views of FIGS. 4–6 for purposes of their respective, side-by-side comparison with the conventional method and apparatus shown in FIGS. 1–3. In FIGS. 4–6, the die 14 of the package 12 is shown thicker than that in the package 12 of FIGS. 1–3, thereby necessitating a thicker plastic mold cap, or body 10, on the package.

The method comprises spacing the parts 22, 24 of an existing mold apart from each other by the amount of the desired increase $T_2$ in the thickness $T_1$ of the body 10, thereby defining a space 40 between the respective interfacial surfaces 28, 30 of the mold parts 22, 24. A shim 100 having a thickness of $T_2$ is then interposed between the spaced-apart parts 22, 24 of the mold such that it effectively fills the space 40 created between their interfacial surfaces 28, 30.

Figure 7:
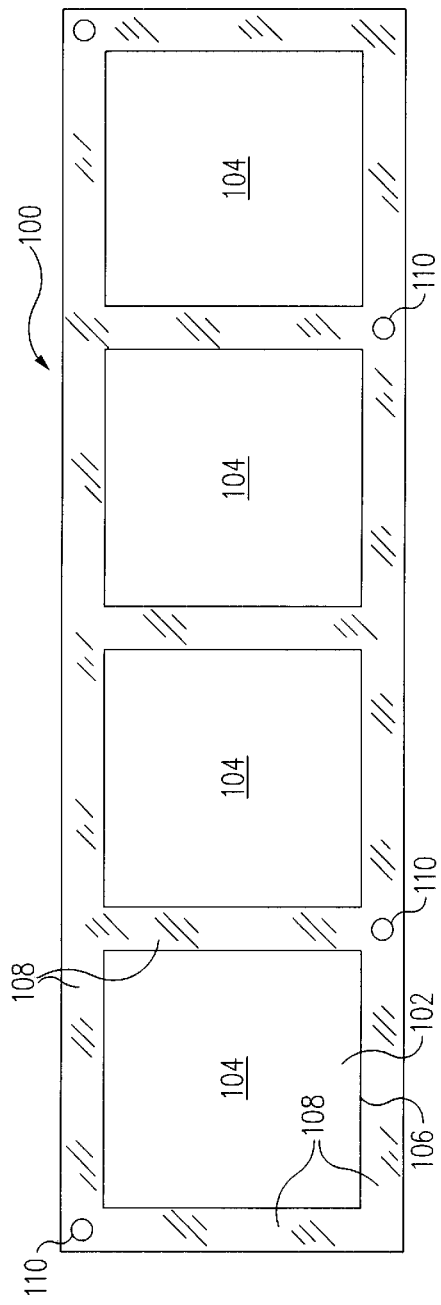
FIG. 7 is a top plan view of an exemplary embodiment of a shim in accordance with the present invention.

The novel shim 100 may comprise a plurality of individual shims connected together end-to-end for use in conjunction with a production mold capable of molding a plurality of package bodies simultaneously, as shown in the top plan view of FIG. 7. The shim 100 has an interior portion 102 with an opening 104 through it. The opening 104 has a periphery 106 that corresponds to the periphery 42 of the cavity 34 of the mold (see FIG. 5). The shim 100 has peripheral portion 108 surrounding the opening 104 that generally conforms in length, width, thickness and configuration to the interfacial space 40 created between the mold parts 22, 24 when they are spaced apart. In the fabrication of the exemplary BGA package 12 illustrated in the figures, the shim 100 is interposed between the top surface 16 of the substrate 18 of the package and the bottom, interfacial surface 28 of the top chase 22 of the mold, as shown in the cross-sectional side elevation and plan views FIGS. 5 and 8, respectively.

In FIG. 5, it may be seen that, when the shim 100 is clamped forcefully between the mold parts 22, 24, with the respective peripheries 42, 106 of the cavity 42 and the opening 104 in the shim in contiguous alignment with each other, the length and width of the cavity 42 of the mold remain the same, but the height, or thickness $T_1$, of the cavity, and hence, the thickness of the body 10 produced by it, is increased by the thickness $T_2$ of the shim 100 to a new, "effective" thickness $T_3=T_1+T_2$. The original thickness $T_1$ of the body 10 and the increase $T_2$ in its thickness produced by the "stretched" cavity 34 are shown cross-hatched in different directions in the strip of packages 12 illustrated in FIG. 9.

Figure 9:
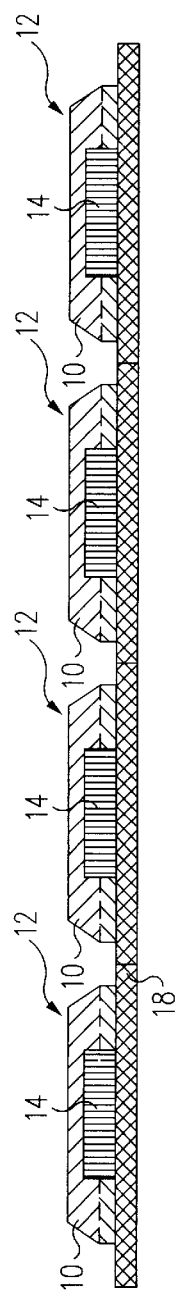

For production efficiency, it is conventional to mold a plurality of semiconductor packages 12 simultaneously while they are connected together in the form of an array, or strip, such as that shown in FIG. 9, and then cut or "singulate," the strip into individual packages. In such a production process, it is also conventional to incorporate alignment features, such as corresponding tooling pins and holes in respective ones of the mold chases 22, 24, and the substrate 18, to align them with each other during molding.

Figure 8:
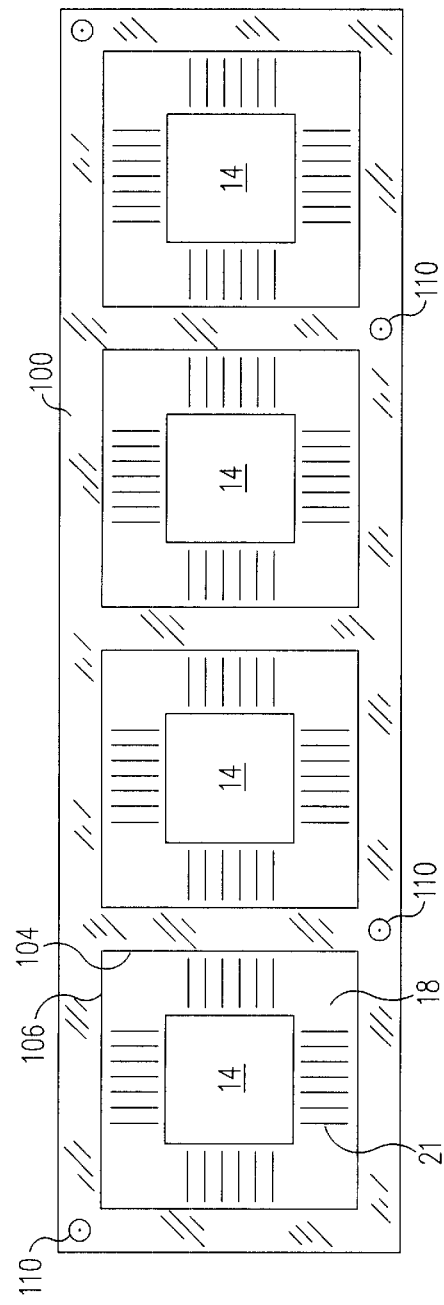
FIG. 8 is a top plan view of the shim shown in FIG. 7 placed on top of and in registration with a strip of nascent BGA semiconductor packages before package body molding; and, FIG. 9 is a cross-sectional side elevation view of the strip of BGA packages shown in FIG. 8 after package body molding.

The method and apparatus of this invention easily accommodate these aspects of the conventional molding process by connecting a plurality of individual shims together in a corresponding shim strip or array 100, as shown in FIGS. 7 and 8, and by incorporating corresponding alignment features, such as the tooling holes 110 shown in the figures, into it. Additionally, it may be desirable to plate the surface of the shim 100 with mold-release coating, such as nodular thin dense chromium ("NTDC") coating, to achieve efficient release of the packages 12 therefrom after molding. Thus, it will be seen that, with the present invention, available production molds or chases can be easily and temporarily modified to do development work, and further, development molds can even be temporarily adapted to do short-term production work while final production molds are being fabricated.

The shim 100 of the invention, which may be made from a hard tool steel, can be produced by a variety of well-known techniques, e.g., photolithography, in less than 3 days, at a cost of less than $50 apiece. The shim 100 can be produced in the form of a "set" of thin, matching laminae of various thicknesses that can be selectively stacked on top of each other to achieve a very fine adjustment in the final thickness $T_3$ of the package body 10.

Indeed, as will be evident to those of skill in the art, many adaptations, variations, and modifications are possible in the method and apparatus of the invention without departing from its scope and spirit. For example, although a BGA type of package 12 is described and illustrated herein in which the substrate 18 comprises an insulative sheet having a single mold cap 10 molded on only one side thereof, the invention is easily adapted to a type of package in which the substrate 18 comprises a "lead frame" having an open lattice of conductive metal leads and a portion of a plastic body molded on both sides thereof.

Similarly, although the respective interfacial surfaces 28, 30 of the mold parts 22 and 24 of the exemplary embodiments are shown and described as substantially planar in configuration, the method and apparatus of the invention are easily adapted to molds in which the interfacial surfaces of the mold parts are arranged in other than a planar form, e.g., in interlocking castellations.

Accordingly, the scope of the present invention should not be limited by that of the particular embodiments described and illustrated herein, as these are merely exemplary in nature, but rather, should correspond to that of the claims appended hereafter.

What is claimed is:

1. A method of molding a plastic body, the method comprising:

mounting a semiconductor die on a substrate to form an assembly thereof;

providing a mold having parts that engage each other at respective interfacial surfaces thereof, at least some of said parts defining a first cavity upon engagement;

providing a shim having a selected thickness and an opening through an interior portion thereof;

interposing said shim between said interfacial surfaces of said mold parts such that said mold parts are spaced apart by said thickness of said shim, and such that said shim opening and said first cavity are juxtaposed, thereby forming a second cavity larger than said first cavity;

interposing said assembly between said interfacial surfaces of said mold parts such that said die and a portion of said substrate reside within said second cavity;

engaging an alignment feature in said shim with corresponding alignment features in said substrate and said mold parts to align said shim, said substrate, and said mold parts with each other; and, filling said second cavity in said mold with a plastic molding compound to form said plastic body therein over said substrate and said die, said plastic molding compound running to said second cavity on said shim through a inner bounded by said shim and a said interfacial surface.

2. The method of claim 1, wherein said substrate comprises an insulative sheet having a plurality of conductive traces on a surface thereof.

3. The method of claim 1, wherein said substrate comprises a lead frame having an open lattice of metal leads.

4. The method of claim 1, further comprising forming a mold-release coating on a surface of said shim.

5. Apparatus for molding a plastic body, the apparatus comprising:

a mold having parts that engage each other at respective interfacial surfaces thereof, at least some of said parts defining a first cavity upon engagement;

a shim having a selected thickness and an opening through an interior portion thereof interposed between said interfacial surfaces of said mold parts such that said mold parts are spaced apart by said thickness of said shim, and such that said shim opening and said first cavity are juxtaposed, thereby forming a forming a second cavity larger than said first cavity within said mold in which said plastic body is molded, wherein a plastic mold compound enters said second cavity by running on said shim through a runner bounded by said shim and a said interfacial surface; and corresponding alignment features in each of said mold parts and said shim for aligning said mold parts and said shim with each other.

6. The apparatus of claim 5, further comprising a mold-release coating on a surface of said shim.

7. The apparatus of claim 5, wherein said shim comprises a stack of thin, matching laminae having a height equal to said selected thickness.

8. A method of molding a plastic body of a semiconductor package, the method comprising:

providing a mold having parts that engage each other at respective interfacial surfaces thereof, at least some of said parts defining a first cavity upon engagement;

providing a shim having a selected thickness and an opening through an interior portion thereof;

interposing said shim between said interfacial surfaces of said mold parts such that said mold parts are spaced apart by said thickness of said shim, and such that said shim opening and said first cavity are juxtaposed, thereby forming a second cavity larger than said first cavity;

mounting a semiconductor die to a substrate to form an assembly thereof;

interposing said assembly between said interfacial surfaces of said mold parts such that said die and a portion of said substrate reside within said second cavity;

engaging an alignment feature in said shim with corresponding alignment features in said substrate and said mold parts to align said shim, said substrate and said mold parts with each other; and, filling said second cavity in said mold with a plastic molding compound such that said molding compound forms a plastic body over said substrate and said die, wherein the plastic mold compound enters said second cavity by running on said shim through a runner bounded by said shim and a said interfacial surface.

9. The method of claim 8, wherein said substrate comprises an insulative sheet having a plurality of conductive traces on a surface thereof.

10. The method of claim 8, wherein said substrate comprises a lead frame having an open lattice of metal leads.

* * * * *